(12) United States Patent
Kuo et al.

(10) Patent No.: US 10,707,281 B2
(45) Date of Patent: Jul. 7, 2020

(54) DISPLAY APPARATUS

(71) Applicant: Au Optronics Corporation, Hsinchu (TW)

(72) Inventors: Ya-Pei Kuo, Hsinchu (TW); Peng-Yu Chen, Hsinchu (TW); Hong-Shiung Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/371,087

(22) Filed: Mar. 31, 2019

(65) Prior Publication Data

US 2020/0052048 A1 Feb. 13, 2020

Related U.S. Application Data

(60) Provisional application No. 62/717,036, filed on Aug. 10, 2018.

(30) Foreign Application Priority Data

Jan. 15, 2019 (TW) .............................. 108101518 A

(51) Int. Cl.
*H01L 27/32* (2006.01)
*G06F 1/16* (2006.01)
*G09G 3/3225* (2016.01)

(52) U.S. Cl.
CPC ........ *H01L 27/3234* (2013.01); *G06F 1/1605* (2013.01); *G09G 3/3225* (2013.01); *H01L 27/326* (2013.01)

(58) Field of Classification Search
CPC ...... G09G 3/20; G09G 3/3607; G09G 3/3674; G09G 3/3685; G09G 3/3688; G09G 2310/027; G09G 2310/0275; G09G 2310/0286; G09G 2310/0291; G09G 2310/08; G09G 2330/02; G09G 3/3208; G09G 3/3225; G06F 1/1605; G06F 1/1626; G06F 3/0412; G06F 3/0416; G06F 3/044;
(Continued)

(56) References Cited

U.S. PATENT DOCUMENTS 9,830,855 B1 11/2017 Li
2017/0123557 A1* 5/2017 Na .................. G06F 3/0416
(Continued)

FOREIGN PATENT DOCUMENTS

CN 106057855 10/2016
CN 107946341 4/2018
(Continued)

*Primary Examiner* — Nelson M Rosario
(74) *Attorney, Agent, or Firm* — JCIPRNET

(57) ABSTRACT

A display apparatus is provided. The display apparatus has a display region including a first display region and a second display region. The display apparatus includes a substrate, a plurality of first signal lines and a plurality of second signal lines. The substrate includes a plurality of first pixels, a plurality of second pixels, at least one first active element, and a plurality of second active elements. The at least one first active element is disposed outside the first display region and controls the first pixels. The second active elements are disposed in the second display region and control the second pixels. Furthermore, another display apparatus is also provided.

15 Claims, 17 Drawing Sheets

(58) Field of Classification Search
CPC ..... G09F 9/33; H01L 27/3234; H01L 27/326;
H04M 1/0266
See application file for complete search history.

(56) References Cited

U.S. PATENT DOCUMENTS

| | | | |
|---|---|---|---|
| 2017/0277219 A1 | 9/2017 | Chung et al. | |
| 2017/0287429 A1* | 10/2017 | Kong | G09G 3/3607 |
| 2017/0345365 A1 | 11/2017 | Li | |

FOREIGN PATENT DOCUMENTS

| | | |
|---|---|---|
| CN | 207264062 | 4/2018 |
| CN | 207338380 | 5/2018 |

* cited by examiner

DISPLAY APPARATUS

CROSS-REFERENCE TO RELATED APPLICATION

This application claims the priority benefit of U.S. provisional application Ser. No. 62/717,036, filed on Aug. 10, 2018, and Taiwan application serial no. 108101518, filed on Jan. 15, 2019. The entirety of each of the above-mentioned patent applications is hereby incorporated by reference herein and made a part of this specification.

BACKGROUND

Technical Field

The disclosure relates to a display apparatus.

Description of Related Art

In a general mobile phone, a notch region is disposed in the upper part of the screen of the mobile phone for disposing a photographing element or other elements with different functions, thereby enabling the mobile phone to realize different functions.

However, since the notch region occupies a part of the screen area, and the notch region cannot display an image, this causes the entire image display region to have a gap, and such a mobile phone is difficult to realize a high screen-to-body ratio (full screen) design.

SUMMARY

In an embodiment of the disclosure, a display apparatus is provided. The display apparatus has a display region including a first display region and a second display region. The display apparatus includes a substrate, a first driving circuit, a plurality of first signal lines and a plurality of second signal lines. The substrate includes a plurality of first pixels, a plurality of second pixels, at least one first active element, and a plurality of second active elements. The first pixels are disposed in the first display region. The second pixels are disposed in the second display region. The at least one first active element is disposed outside the first display region and is electrically connected to at least one of the first pixels. The second active elements are disposed in the second display region and are respectively electrically connected to the second pixels. The first driving circuit is disposed on the substrate. The first signal lines include a plurality of first-group first signal lines and a plurality of second-group first signal lines. The first-group first signal lines are electrically connected to the at least one first active element and the first driving circuit. The second-group first signal lines are respectively electrically connected to the second active elements and the first driving circuit.

In an embodiment of the disclosure, a display apparatus is provided. The display apparatus has a display region including a first display region and a second display region. The display apparatus includes a substrate. The substrate includes a plurality of first pixels, a plurality of second pixels, at least one first active element, and a plurality of second active elements. The first pixels are disposed in the first display region. The second pixels are disposed in the second display region. The at least one first active element is disposed in a border region and is electrically connected to at least one of the first pixels. The second active elements are disposed in the second display region and are respectively electrically connected to the second pixels.

In order to make the aforementioned features and advantages of the disclosure comprehensible, embodiments accompanied with drawings are described in detail below.

DESCRIPTION OF THE EMBODIMENTS

Figure 1A:
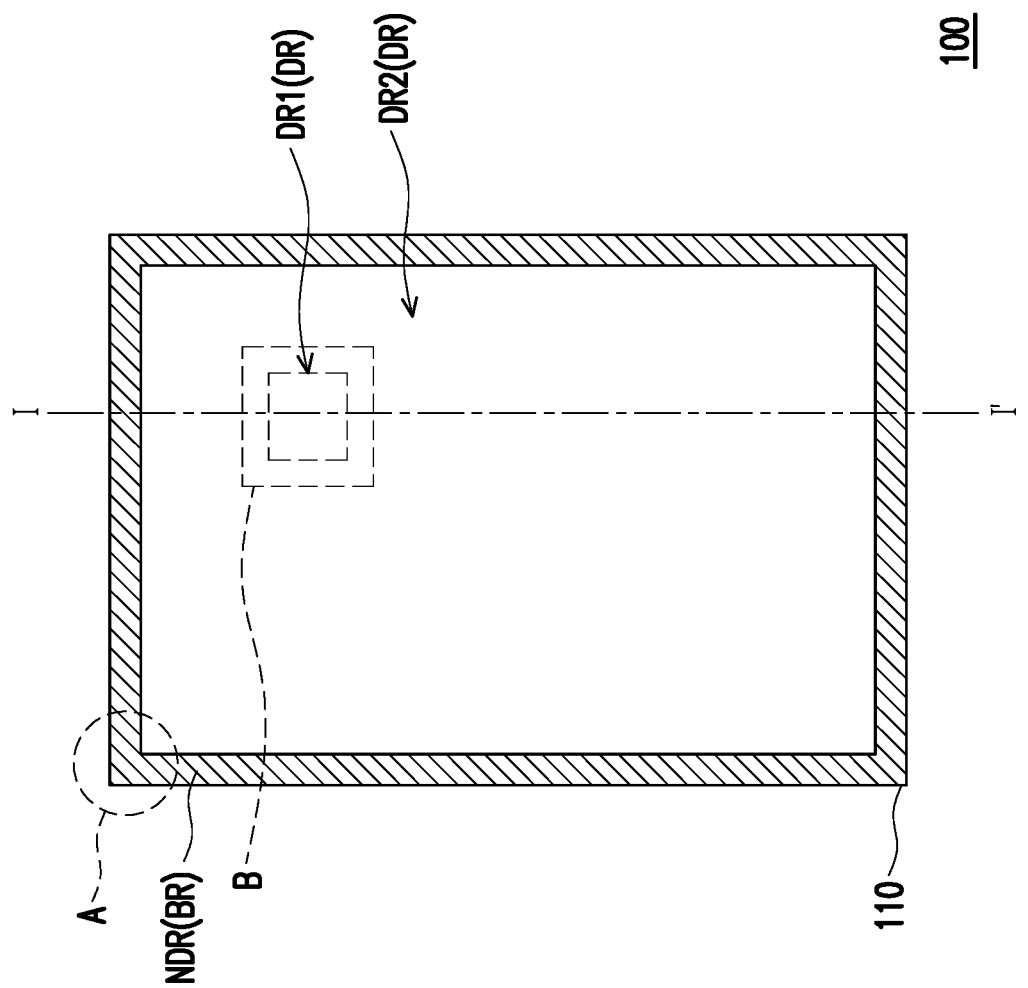
FIG. 1A is a schematic top view of a display apparatus according to an embodiment of the disclosure.
Figure 1B:
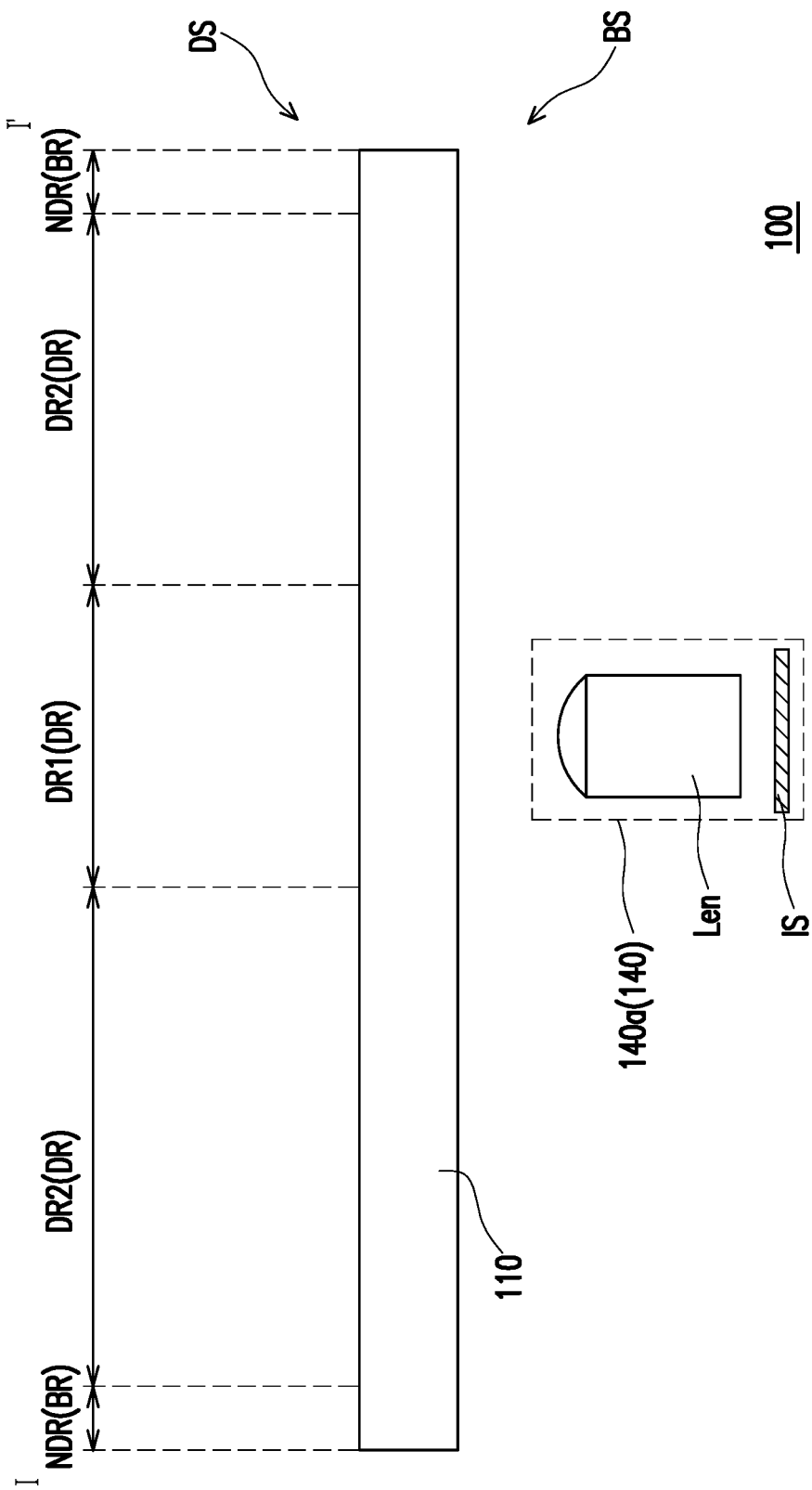
FIG. 1B is a schematic cross-sectional view taken along the section line I-I' of FIG. 1A.
Figure 1C:
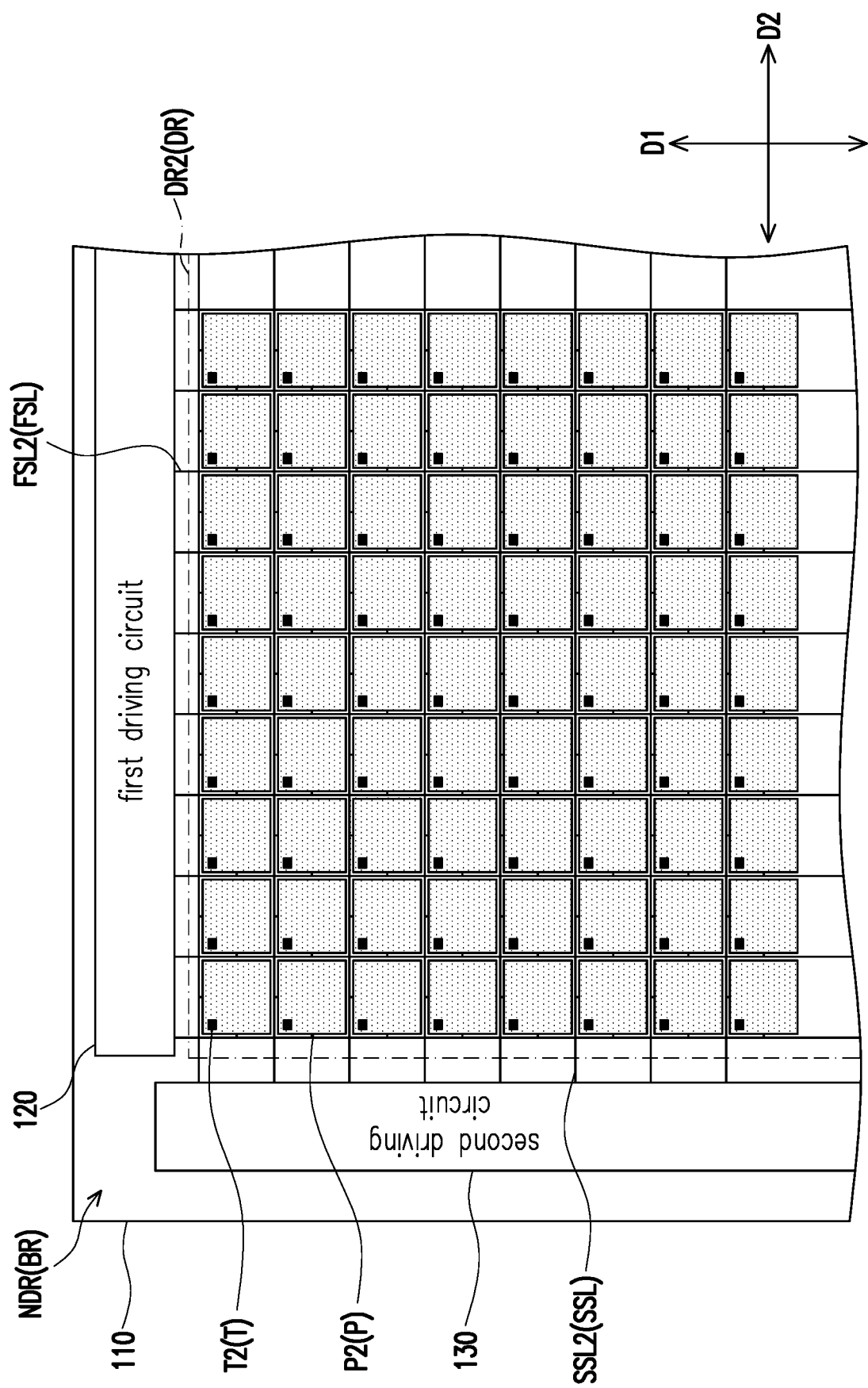
FIG. 1C is an enlarged schematic view of the region A in FIG. 1A.
Figure 1D:
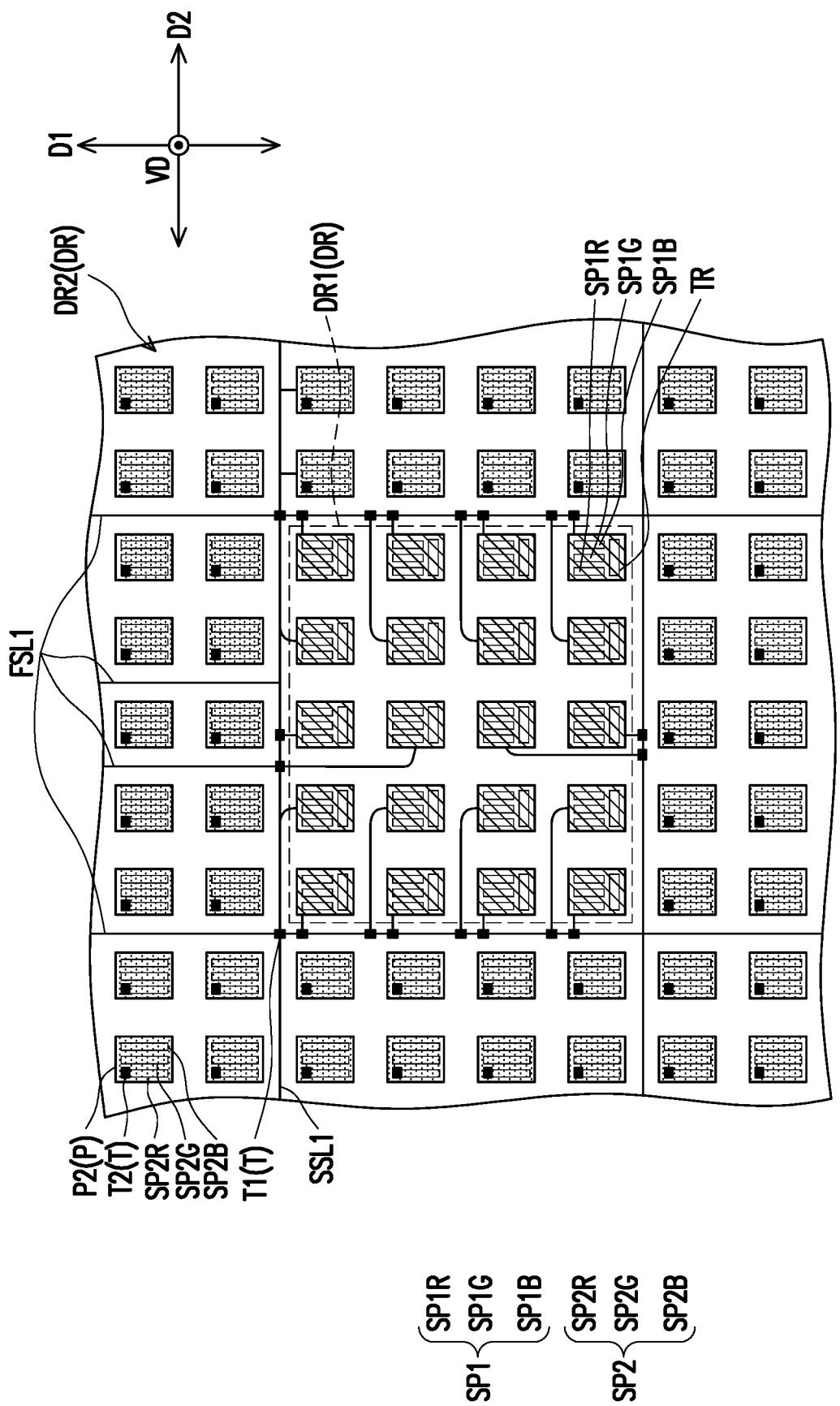
FIG. 1D is an enlarged schematic view of the region B in FIG. 1A.
Figure 1E:
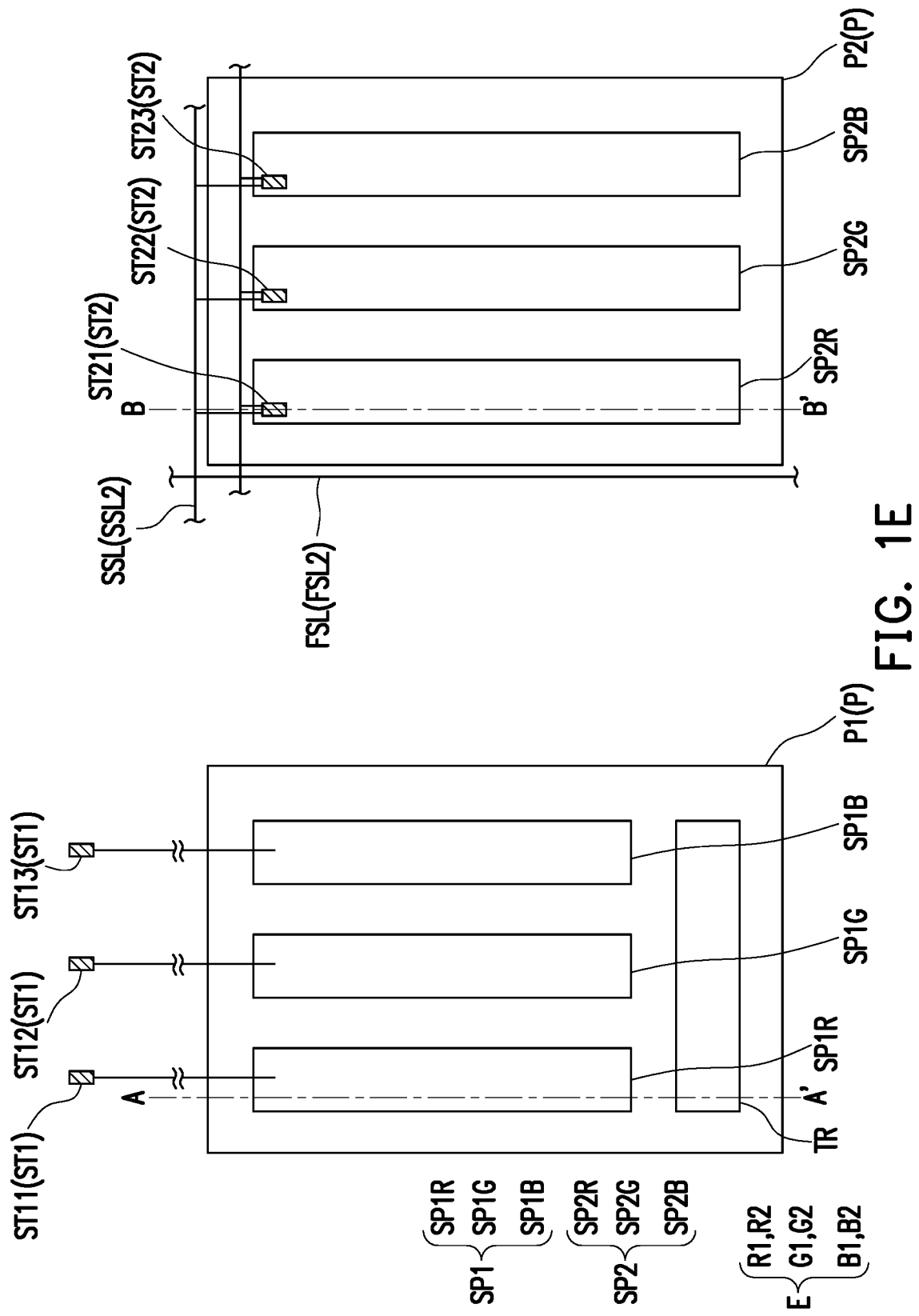
FIG. 1E is a schematic top view of the first pixels and the second pixels in FIG. 1D.
Figure 1F:
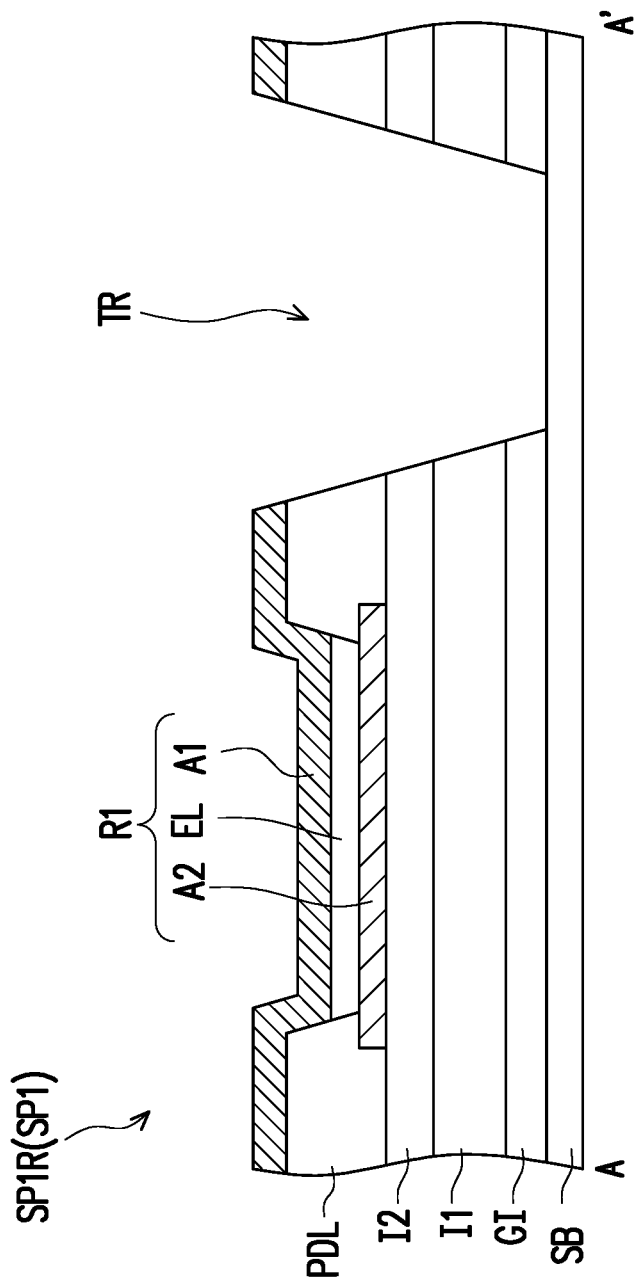
FIG. 1F is a cross-sectional view of the first sub-pixels in the first pixels of FIG. 1D.
Figure 1G:
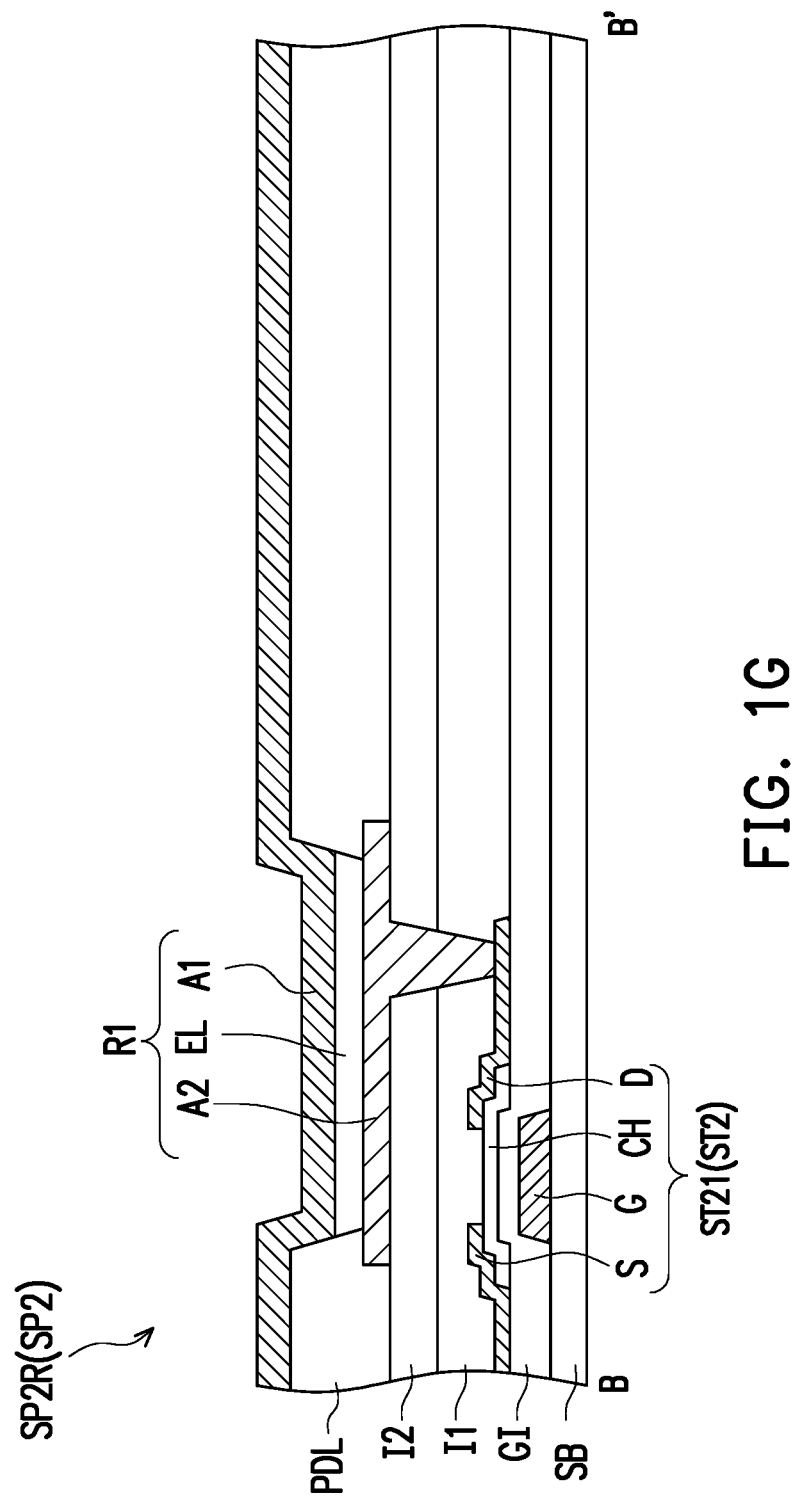
FIG. 1G is a cross-sectional view of the second sub-pixels in the second pixels of FIG. 1D.

FIG. 1A is a schematic top view of a display apparatus according to an embodiment of the disclosure. FIG. 1B is a schematic cross-sectional view taken along the section line I-I' of FIG. 1A. FIG. 1C is an enlarged schematic view of the region A in FIG. 1A. FIG. 1D is an enlarged schematic view of the region B in FIG. 1A. FIG. 1E is a schematic top view of the first pixels and the second pixels in FIG. 1D. FIG. 1F is a cross-sectional view of the first sub-pixels in the first pixels of FIG. 1D. FIG. 1G is a cross-sectional view of the second sub-pixels in the second pixels of FIG. 1D. It should be noted that the top view structures of the first pixels and the second pixels are more specifically shown in FIG. 1D, while the first and second pixels are briefly illustrated by different illustration methods in other drawings. In addition, for clarity in illustration, FIG. 1D shows only the circuit configuration in the first display region, and the circuit configuration in the second display region is familiar to one of ordinary skill in the art and is thus omitted.

Functions respectively corresponding to different regions in a display apparatus 100 will be described first.

First, with reference to FIG. 1A, the display apparatus 100 in the embodiment has a display region DR and a non-display region NDR adjacent to the display region DR. The non-display region NDR is located outside the display region DR and is also referred to as a border region BR. In the embodiment, the display region DR is a region for displaying an image in the display apparatus 100, and the non-display region NDR is, for example, a region for disposing circuit elements or wirings in the display apparatus 100 but is not limited thereto. The display region DR further includes a first display region DR1 and a second display region DR2.

With reference to FIG. 1B, the display apparatus 100 has a display side DS and a back side BS opposite to each other. The display region DR faces toward the display side DS, and a user is located nearby the display side DS to view the image displayed by the display region DR. The back side BS is a side facing away from the display side DS.

With reference to FIGS. 1A to 1G, in the embodiment, the display apparatus 100 includes a substrate 110, a first driving circuit 120, a second driving circuit 130, a plurality of first signal lines FSL, a plurality of second signal lines SSL, and a function module 140. The above elements will be described in detail in the following paragraphs.

The substrate 110 is a semiconductor substrate including a plurality of semiconductor stack layers and is, for example, a pixel array substrate. In the embodiment, the substrate 110 is, for example, a thin film transistor substrate (TFT substrate) but is not limited thereto. The substrate 110 includes a plurality of pixels P and a plurality of active elements T. The pixels P are configured to display an image in the display region DR of the display apparatus 100, and the active elements T are electrically connected to the pixels P.

With reference to FIGS. 1A, 1C and 1D, the pixels P further include a plurality of first pixels P1 and a plurality of second pixels P2. The active elements T include at least one first active element T1 and a plurality of second active elements T2. In the embodiment, the number of the first active element T1 is, for example, a plurality. The first pixels P1 are located in the first display region DR1 and are arranged, for example, in a matrix in the first display region DR1. The second pixels P2 are located in the second display region DR2 and are arranged, for example, in a matrix in the second display region DR2. The first active elements T1 are electrically connected to at least one of the first pixels P1. The second active elements T2 are respectively electrically connected to the second pixels P2.

The first driving circuit 120 and the second driving circuit 130 respectively provide driving signals to the pixels P to display the image according to image data. With reference to FIG. 1C, the first driving circuit 120 and the second driving circuit 130 are both disposed in the non-display region NDR and are respectively disposed on two different sides of the substrate 110. In the embodiment, the first driving circuit 120 is, for example, a data driving circuit, and the second driving circuit 130 is, for example, a gate driving circuit, but they are not limited thereto.

The first signal lines FSL and the second signal lines SSL are respectively configured to transmit signals to the pixels P. With reference to FIGS. 1C and 1D, the extending direction of the first signal lines FSL is different from the extending direction of the second signal lines SSL, and the first signal lines FSL and the second signal lines SSL are disposed intersecting one another on the substrate 110. The first signal lines FSL extend in the direction from the first driving circuit 120 to the display region DR, and the second signal lines SSL extend in the direction from the second driving circuit 130 to the display region DR. In the embodiment, the first signal lines FSL are, for example, data lines, and the second signal lines SSL are, for example, gate lines, but they are not limited thereto.

The function module 140 generally refers to a module element capable of realizing various different functions. For example, the function module 140 is a camera module, a light intensity sensing module, a sound wave transceiver module, or other modules with different functions. The camera module is, for example, a module having a photographing function. The light intensity sensing module is, for example, an optical sensing module that senses the light intensity of an external light beam. The sound wave transceiver module is, for example, a module capable of transmitting sound waves or sensing sound waves. With reference to FIG. 1B, in the embodiment, the function module 140 is embodied as a camera module 140a. The camera module 140 includes an imaging module Len and an image sensor IS. The imaging module Len is, for example, configured to receive an external light beam and form an image of the external light beam on a sensing surface of the image sensor IS. In one embodiment, the imaging module Len is an optical imaging lens including a plurality of lenses with different diopters. In another embodiment, the imaging module Len is a lens array, that's to say, a plurality of optical lenses arranged in an array, and the disclosure is not limited thereto.

The following paragraphs will describe in detail the disposition positions of the first active elements T1 and the second active elements T2, the circuit layout among the pixels P, the specific structure of each pixel P, the circuit layout in each pixel P, and the disposition relationship between the first pixels P1 and the camera module 140a.

First, the disposition positions of the first active elements T1 and the second active elements T2 will be described first.

With reference to FIG. 1D, in the embodiment, the first active elements T1 are disposed outside the first display region DR1. More specifically, the first active elements T1 are disposed between the first display region DR1 and the second display region DR2 and are dispersedly disposed around the first display region DR1 for example. From another point of view, the orthographic projection regions of the first active elements T1 on the substrate 110 do not overlap the first display region DR1. In other words, there are no active elements T in the first display region DR1.

With reference to FIGS. 1C and 1D, on the other hand, the second active elements T2 are disposed in the second display region DR2. More specifically, the second active elements T2 are respectively disposed in the second pixels P2.

Next, the circuit layout among the pixels P is described.

In order to describe the circuit layout among the pixels P, the criteria of grouping the first signal lines FSL and the second signal lines SSL have to be described first. The first signal lines FSL are divided into a plurality of groups according to the electrical connection relationship with the first active elements T1, the second active elements T2 and the first driving circuit 120. The second signal lines SSL are also divided into a plurality of groups according to the electrical connection relationship with the first active elements T1, the second active elements T2 and the second driving circuit 130. The specific electrical connection relationships will be described in the following paragraphs.

With reference to FIGS. 1C and 1D, the first signal lines FSL are divided into first-group first signal lines FSL1 and second-group first signal lines FSL2, and the main difference is that the first-group first signal lines FSL1 are electrically connected to the at least one first active element T1 and the first driving circuit 120. The second-group first signal lines FSL2 are respectively electrically connected to a part of the second active elements T2 and the first driving circuit 120.

In addition, the second signal lines SSL are also divided into first-group second signal lines SSL1 and second-group second signal lines SSL2, and the main difference is that the first-group second signal lines SSL1 are electrically connected to the at least one first active element T1 and the second driving circuit 130. The second-group second signal lines SSL2 are respectively electrically connected to a part of the second active elements T2 and the second driving circuit 130.

With reference to FIG. 1C, FIG. 1C shows the circuit layout of the second-group first signal lines FSL2 and the second-group second signal lines SSL2.

The second-group first signal lines FSL2 extend in a direction D1. The second-group second signal lines SSL2 extend in a direction D2. The direction D1 is perpendicular to the direction D2. Each of the second-group first signal lines FSL2 is electrically connected to the first driving circuit 120 and electrically connected to the corresponding second pixel P2. Each of the second-group second signal lines SSL2 is respectively electrically connected to the second driving circuit 130 and electrically connected to the corresponding second pixel P2.

With reference to FIG. 1D, FIG. 1D shows the circuit layout of the first-group first signal lines FSL1 and the first-group second signal lines SSL1.

The respective vertical projections of the at least one first active element T1 and the first-group first signal lines FSL1 between the second display region DR2 and the first display region DR1 on the substrate 110 overlap each other. Specifically, the number of the first active element T1 is a plurality. The first active elements T1 are respectively electrically connected to the first pixels P1. The disposition positions of each of the first active elements T1 or at least a part of the first active elements T1 correspond to the first-group first signal lines FSL1. The meaning of "disposition position correspondence" as used in this paragraph is that each of the first active elements T1 or at least a part of the first active elements T1 overlap the first-group first signal lines FSL1 in the vertical direction VD; that is, the projected area of the first active elements T1 projected on the substrate 110 in the vertical direction VD and the projected area of the first signal lines FSL1 projected on the substrate 110 in the vertical direction VD have an overlapping region. In detail, the projected area of the first active elements T1 on the substrate 110 completely or partially overlap the projected area of the first signal lines FSL1 on the substrate 110. Then, wirings are extended from the first active elements T1 individually to be electrically connected to the first pixels P1 in a one-to-one manner. It should be noted that, in order to simplify the drawings, the wiring extending from a single first active element T1 in the first display region DR1 is illustrated as one as an example, which is only used to illustrate the electrical connection relationship as an example, and the number of the wiring may be two or a plurality in practice. The vertical direction VD is perpendicular to the directions D1 and D2 or is the normal vector of the substrate 110.

The respective vertical projections of the at least one first active element T1 and the second-group first signal lines SSL1 in a region of the second display region DR2 adjacent to the first display region DR1 on the substrate 110 overlap each other. Specifically, the first active elements T1 are respectively electrically connected to the first pixels P1. The disposition positions of each of the first active elements T1 or at least a part of the first active elements T1 correspond to the second-group first signal lines SSL1. The meaning of "disposition position correspondence" as used in this paragraph is that each of the first active elements T1 or at least a part of the first active elements T1 overlap the second-group first signal lines SSL1 in the vertical direction VD. Then, wirings are extended from a part of the first active elements T1 to be electrically connected to the first pixels P1 in a one-to-one manner.

Therefore, in the display apparatus 100 in the embodiment, the first driving circuit 120 and the second driving circuit 130 can be electrically connected to the first and second active elements T1 and T2 through the circuit layouts of the first-group and second-group first signal lines FSL1 and FSL2 and the first-group and second-group second signal lines SSL1 and SSL2 to further control the first pixels P1 and the second pixels P2 to display the image.

Based on the above, in the embodiment, the first active elements T1 are located outside the first display region DR1, whereby the light transmittance of the first display region DR1 is greatly improved. In addition, since the second pixels P2 in the second display region DR2 are respectively disposed with the corresponding second active element T2, the transmittance of the second display region DR2 is lower than the transmittance of the first display region DR1.

In the embodiment, the signal lines for connecting the first pixels P1 in the first display region DR1 also connect the second pixels P2 in the second display region DR2—that is, the signal lines of the two display regions DR1 and DR2 are shared. In other word, a signal line electrically connects both display region DR1 (active element T1) and display region DR2 (active element T2). In other embodiments, the signal lines of the two display regions DR1 and DR2 are not necessarily shared, and the disclosure is not limited to the above. That is, a signal line electrically connects only display region DR1 (active element T1) and another signal line electrically connects only display region DR2 (active element T2).

Next, the specific structure of each pixel P and the circuit layout in each pixel P are described.

In the embodiment, the structure of the first pixels P1 disposed in the first display region DR1 is different from the structure of the second pixels P2 disposed in the second display region DR2. The following paragraphs will first describe the difference between the first pixels P1 and the second pixels P2.

With reference to FIGS. 1D and 1E, the first pixels P1 include a plurality of first sub-pixels SP1 (exemplified with three first sub-pixels SP1) and a transmission region TR. The second pixels P2 include a plurality of second sub-pixels SP2 (exemplified with three second sub-pixels SP2). Since the first pixels P1 further has the transmission region TR compared with the second pixels P2, the transmittance of the first pixels P1 is higher than the transmittance of the second pixels P2.

With reference to FIG. 1F, in order to describe the specific structures of the first pixels P1 and the second pixels P2 of the substrate 110, only a first sub-pixel SP1R in the first pixels P1 and a second sub-pixel SP2R in the second pixels P2 are used as an example for description here. The other first sub-pixels SP1G and SP1B in the first pixels P1 are similar to the first sub-pixel SP1R. In addition, the other second sub-pixels SP2G and SP2B in the second pixels P2 are similar to the second sub-pixel SP2R.

In detail, the first sub-pixel SP1R is disposed on a substrate SB and a gate insulating layer GI, and the first sub-pixel SP1R includes a red light emitting element, insulating layers I1 and I2, and a pixel defining layer PDL.

In the embodiment, the type the light emitting element disposed in the first sub-pixels SP1 is, for example, an organic light emitting diode (OLED). Specifically, the red light emitting element includes a light emitting layer EL, an electrode layer A1, and an electrode layer A2. The light emitting layer EL is interposed between the electrode layer A1 and the electrode layer A2, and the electrode layers A1 and A2 are electrically connected, wherein the electrode layer A1 is, for example, a cathode, and the electrode layer A2 is, for example, an anode, but they are not limited thereto. The electrode layers A1 and A2 are electrically connected to a first sub-active element ST11 through a wiring. The material of the light emitting layer EL is, for example, an organic light emitting material and is, for example, an organic light emitting material that emits red light after electroluminescence.

The insulating layers I1 and I2 are disposed between the red light emitting element and the gate insulating layer GI.

The pixel defining layer PDL is also referred to as a pixel definition layer, which exposes a region where the first sub-pixel SP1R forms the light emitting layer EL. Moreover, the pixel defining layer PDL is further configured to separate the light emitting layers located in the other first sub-pixels SP1.

In addition, the transmission region TR is disposed nearby the first sub-pixel SP1R. In the embodiment, a light transmitting material is disposed in the transmission region TR, which is, for example, air or a light transmitting material but is not limited thereto. Further, in FIG. 1F, the transmission region TR is disposed with the substrate SB and is not disposed with other layers. In other embodiments, one to a plurality of insulating layers or light emitting layers or the like is selectively disposed according to process requirements. It should be noted that the transmission region TR is not disposed with a layer that lowers the light transmittance. For example, the transmission region TR is not disposed with a metal layer (such as a cathode of an organic light emitting diode). Specifically, in the embodiment of FIG. 1F, each layer (such as the insulating layer, the light emitting layer, the metal layer, etc.) forms an opening in the transmission region TR, thereby increasing the transmittance of the transmission region TR (relative to other regions), but the disclosure is not limited thereto; in other modified examples, a part of the insulating layer is still disposed in the transmission region TR, and the light emitting layer and the metal layer form an opening in the transmission region TR, so that the transmission region TR includes the substrate SB and an insulating layer (such as the gate insulating layer GI, the insulating layer I1, the insulating layer I2, etc.).

The structure of the first sub-pixel SP1R and the transmission region TR has been roughly described so far. The structures of the first sub-pixel SP1G and the first sub-pixel SP1B are inferred by analogy, and the difference is that the material selected for the light emitting layer EL correspondingly disposed therein is an organic light emitting material which can emit green light and blue light after electroluminescence.

The difference between the second pixels P2 and the first pixels P1 is mainly that the second pixels P2 are not disposed with the transmission region TR. Moreover, the structure of the second sub-pixel SP2R in the second pixels P2 is similar to the structure of the first sub-pixel SP1R, and the difference is that the second sub-pixel SP2R further includes a second sub-active element ST21.

The second sub-active element ST21 is, for example, a thin film transistor (TFT) including a channel layer CH, a gate G, a source S, and a drain D. The channel layer CH, the gate G, the source S and the drain D are stacked and disposed on the substrate SB. The gate G is electrically connected to the corresponding second signal line SSL (belonging to the second-group second signal lines SSL2) and is electrically connected to the second driving circuit 130 through the second signal line SSL. The gate G overlaps the channel layer CH, and the gate insulating layer GI is interposed between the gate G and the channel layer CH. The source S and the drain D are located on the channel layer CH and are electrically connected to the channel layer CH. The source S is electrically connected to the corresponding first signal line FSL (belonging to the second-group first signal lines FSL2) and is electrically connected to the first driving circuit 120 through the corresponding first signal line FSL.

The second sub-active element ST2 is exemplified by a thin film transistor of a bottom gate type, but the disclosure is not limited thereto. In other embodiments, the second sub-active element ST2 is a thin film transistor of a top gate type or of other types. In addition, the structure of the first sub-active element ST1 is similar to the structure of the second sub-active element ST2, and details are not described herein.

Next, the insulating layers I1 and I2 are disposed between the red light emitting element and the second sub-active element ST2. A via hole filled with a conductive material penetrates through the insulating layers I1 and I2, and one end of the via hole is connected to the electrode layer A2, and the other end of the via hole is connected to the electrode layer A1.

The structure of the second sub-pixel SP2R has been roughly described so far. The structures of the second sub-pixel SP2B and the second sub-pixel SP2G are inferred by analogy, and the difference is that the material selected for the light emitting layer EL correspondingly disposed therein is an organic light emitting material which can emit green light and blue light after electroluminescence.

In addition, in the above embodiment, the type the light emitting element is exemplified by an organic light emitting diode, but the disclosure is not limited thereto. In other embodiments, the types of the light emitting element are changed to a mini LED or a micro LED, wherein the size of the mini LED, for example, falls within a range of 100 micrometers to 200 micrometers, and the size of the micro LED is, for example, a micron-level size, and the size thereof is, for example, less than 100 micrometers and greater than 0 micrometers; the disclosure is not limited to the above. The size of the above-mentioned light emitting diode is defined by, for example, the length of the diagonal of the top view of the light emitting diode, and the disclosure is not limited thereto. In other words, the embodiments of the disclosure is not necessarily configured to drive the organic light emitting diode and is configured to drive light emitting elements of other different types.

It should be noted that each of the first pixels P1 mentioned above includes the plurality of first sub-pixels SP1 and the transmission region TR. The first sub-pixels SP1 include red, green, and blue light emitting elements and the second sub-pixels SP2 of each of the second pixels P2 include red, green, and blue light emitting elements. That is, the type of the first pixels P1 described above is an RGBT type, and the type of the second pixels P2 is an RGB type. In other embodiments, the first pixels P1 are not disposed with the transmission region TR but include another first sub-pixel having a white light emitting element in the region of the transmission region TR of FIG. 1E instead; that is, this embodiment includes four first sub-pixels, and the type of the first pixels P1 is an RGBW type. Alternatively, in an embodiment, the first pixels P1 are not disposed with the transmission region TR; that is, the type of the first pixels P1 is the RGB type.

Lastly, the disposition relationship between the first pixels P1 and the camera module 140a is described.

With reference to FIGS. 1B and 1D, in the embodiment, the camera module 140a is disposed nearby the back side BS of the display apparatus 100 and correspondingly disposed on the back surface of the first display region DR1 on the substrate 110. Since the first display region DR1 has high transmittance, the camera module 140a can capture the external light beam correspondingly and sense the image. In other words, the first display region DR1 has a good light collecting effect. At the same time, the display apparatus 100 also control the first pixels P1 located in the first display region DR1 and the second pixels P2 located in the second display region DR2 to display the image. Therefore, the display apparatus 100 of the embodiment can realize a high screen-to-body ratio design.

In other embodiments, the camera module 140a is replaced with a function module with other functions, and the disclosure is not limited thereto. For example, if the camera module 140a is replaced with a light intensity sensing module, the light intensity sensing module is relatively easy to sense the external light beam.

It is to be noted that the following embodiments use the reference numerals and a part of the contents of the above embodiments, and the same or similar reference numerals are used to denote the same or similar elements, and the description of the same technical content is omitted. Reference may be made to the foregoing embodiments for the description of the omitted part, and details are not described herein.

FIGS. 2 to 7 are enlarged schematic views of different embodiments of the region B in FIG. 1A. It should be noted that a part of the first signal lines FSL and the second signal lines SSL are omitted in FIGS. 2 to 7 for clarity in illustration.

Figure 2:
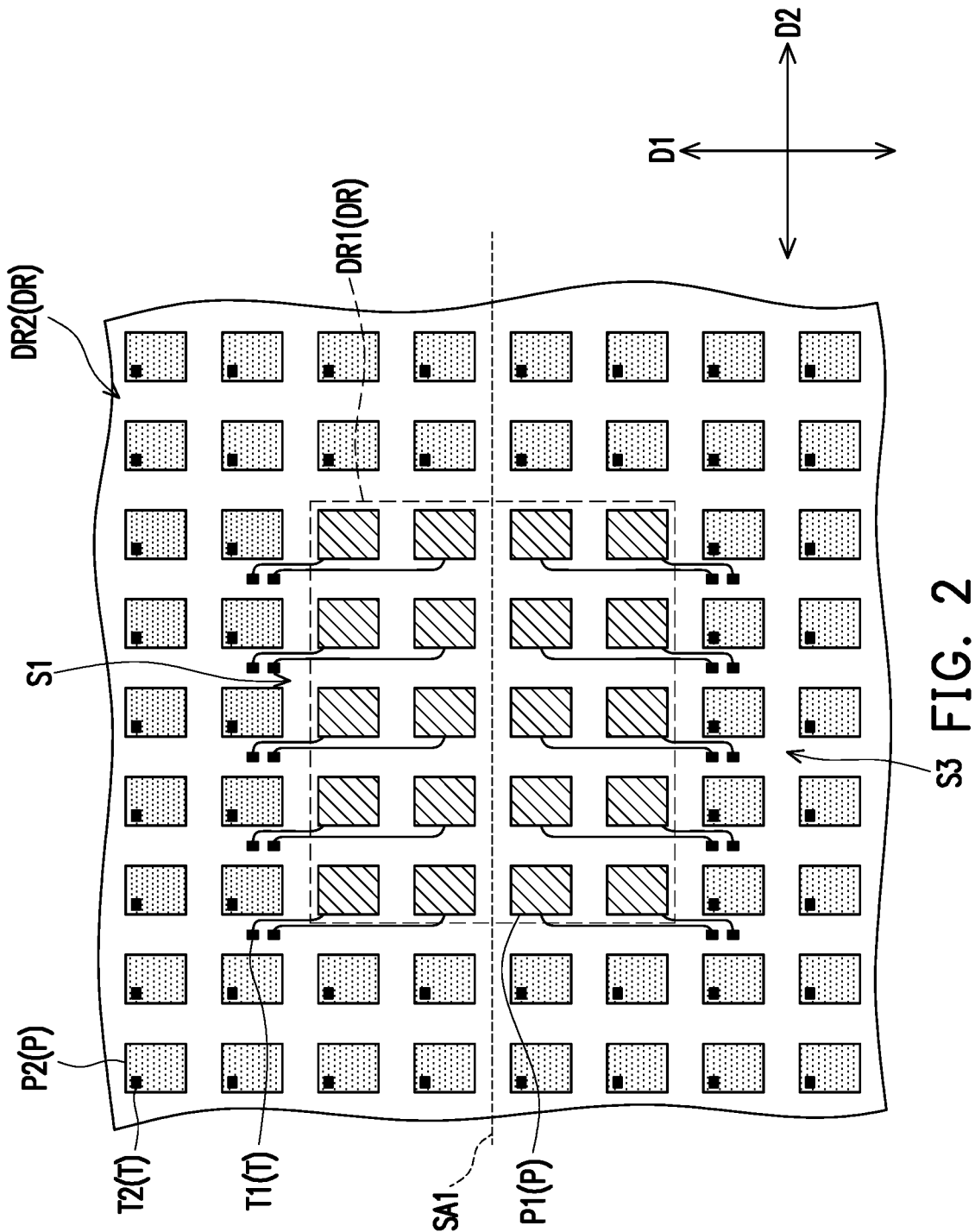
FIGS. 2 to 7 are enlarged schematic views of different embodiments of the region B in FIG. 1A.

With reference to FIG. 2, the layout of the first active elements T1 and relevant wirings of FIG. 2 is different from that of FIG. 1D, and the main difference is that in FIG. 2, the first display region DR1 has a first side S1 and a third side S3 opposite to each other, which are, for example, an upper side and a lower side, respectively. The first display region DR1 has a first symmetry axis SA1 with respect to the first side S1 and the third side S3. The first symmetry axis SA1 is perpendicular to the extending direction D1 of first signal lines FSL. The first active elements T1 are disposed on the first side S1 and the third side S3 of the first display region DR1 according to the first symmetry axis SA1. More specifically, the first active elements T are disposed on the both two sides S1 and S3 of the first display region DR1, for example, according to the first symmetry axis SA1 and in a symmetrical way. In other embodiments, the first active elements T1 are not necessarily disposed in a symmetrical way; for example, the first active elements T1 are dispersedly disposed around the first display region DR1, or the first active elements T1 are collectively disposed in a region outside the first display region; one of ordinary skill in the art can change the disposition positions of the first active elements T1 according to design requirements, and the disclosure is not limited to the above.

In addition, in the embodiment, the first active elements T1 are disposed to overlap the corresponding first signal lines FSL (not shown in FIG. 2). In this way, the aperture ratio of the second display region DR2 can be less affected.

Figure 3:
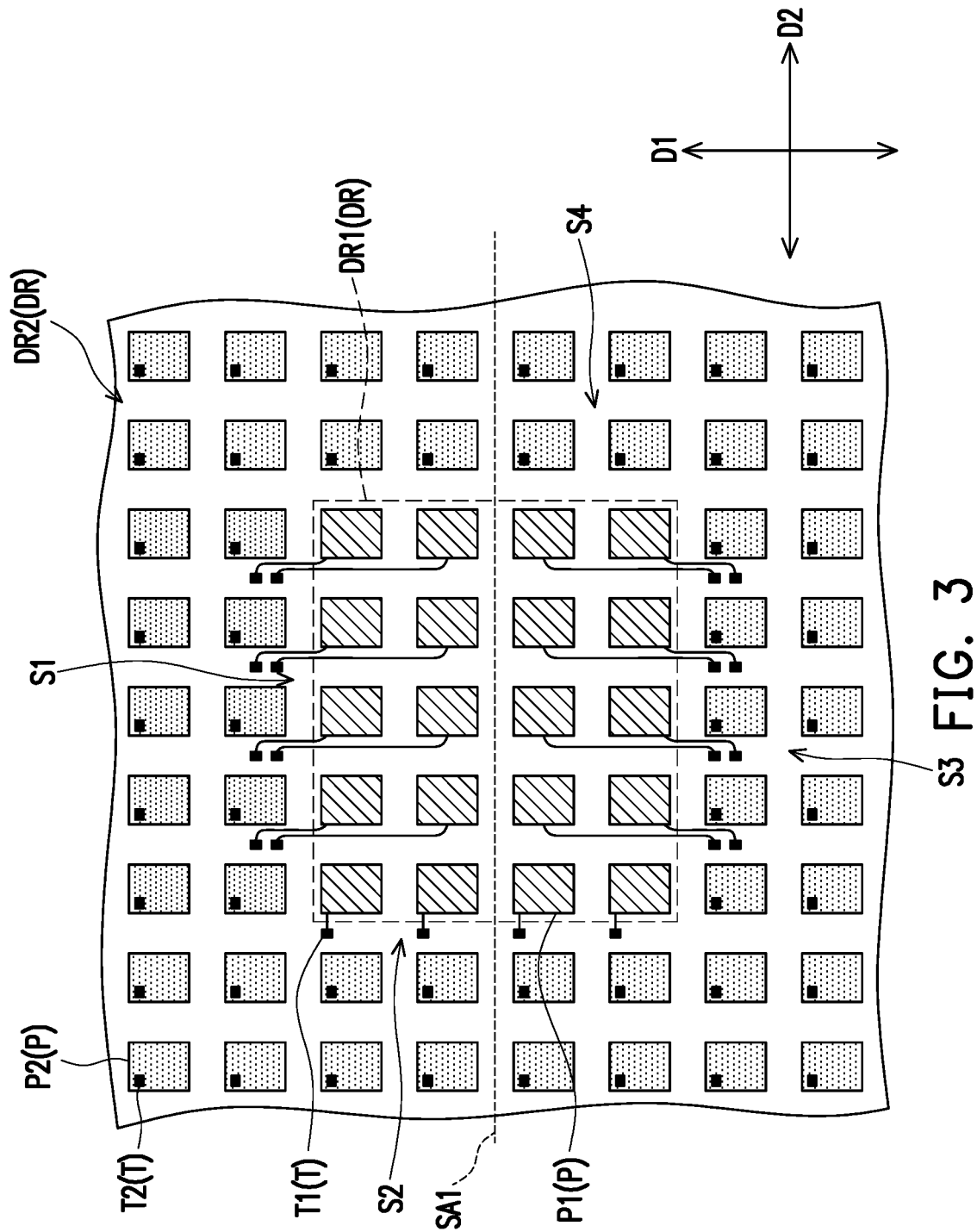

With reference to FIG. 3, the layout of the first active elements T1 and relevant wirings of FIG. 3 is similar to that of FIG. 2, and the main difference is that in FIG. 3, the first display region DR1 further has a second side S2 and a fourth side S4 opposite to each other, which are, for example, a left side and a right side, respectively. A part of the first active elements T1 (i.e., the eight first active elements T1 located on the upper and lower sides) are disposed on the first side S1 and the third side S3 of the first display region DR1 according to the first symmetry axis SA1. The other part of the first active elements T1 (i.e., the four first active elements T1 located on the left side) are disposed on the second side S2 of the first display region DR1. However, the fourth side S4 is not disposed with the first active elements T1. In other embodiments, the first active elements T1 are evenly distributed and disposed around the first display region DR1 or are collectively disposed in a region outside the first display region DR1, etc., and the disclosure is not limited to the above.

Figure 4:
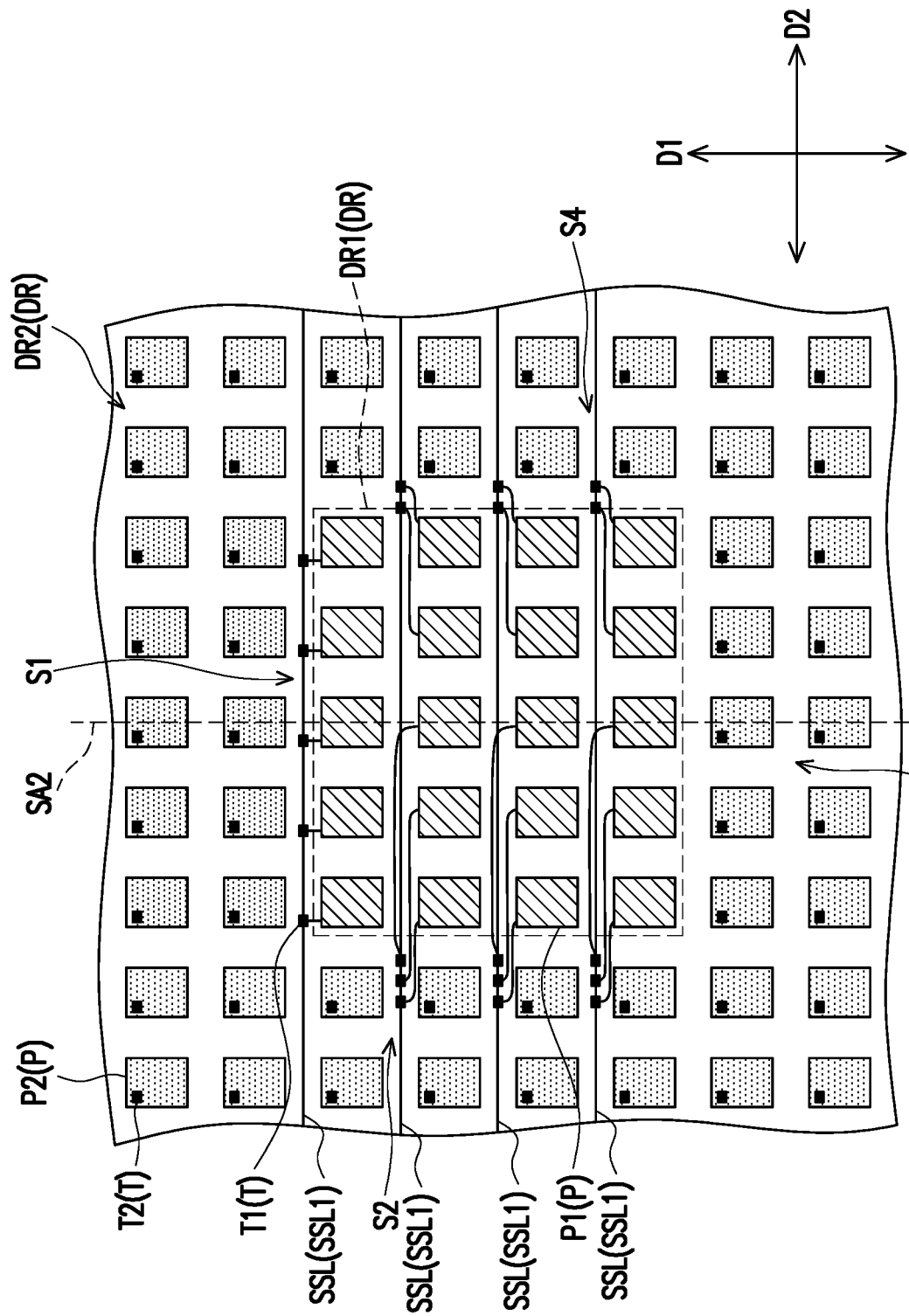

With reference to FIG. 4, the layout of the first active elements T1 is similar to that of FIG. 1D, and the main difference is that in FIG. 4, the first display region DR1 further has a second side S2 and a fourth side S4 opposite to each other, which are, for example, a left side and a right side, respectively. The first display region DR1 has a second symmetry axis SA2 with respect to the second side S2 and the fourth side S4. The second symmetry axis SA2 is perpendicular to the extending direction D2 of the second signal lines SSL. At least a part of the first active elements T1 (the first active elements T1 other than the three first active elements T1 on the leftmost side in FIG. 4) are symmetrically disposed on the second side S2 and the fourth side S4 of the first display region DR1 according to the second symmetry axis SA2. The other part of the first active elements T1 (i.e., the three first active elements T1 on the leftmost side in FIG. 4) are further disposed on the second side S2 of the first display region DR1. In addition, each of the first active elements T1 is disposed on the corresponding second signal line SSL of the first-group second signal lines SSL1. In this paragraph, the meaning of so-called disposition with correspondence is that a part of the first active elements T1 overlaps the second signal lines SSL in the vertical direction VD, and thus the first active elements T1 can less affect the aperture ratio of the second display region DR2. Then, wirings are extended from the first active elements T1 individually to be electrically connected to the first pixels P1 in a one-to-one manner.

In addition, in the embodiment, the first pixels P1 located in the first display region DR1 share the first-group second signal lines SSL1 with the second pixels P2 located in the second display region DR2; in other embodiments, the first-group second signal lines SSL1 are not necessarily shared, and the disclosure is not limited to the above.

Figure 5:
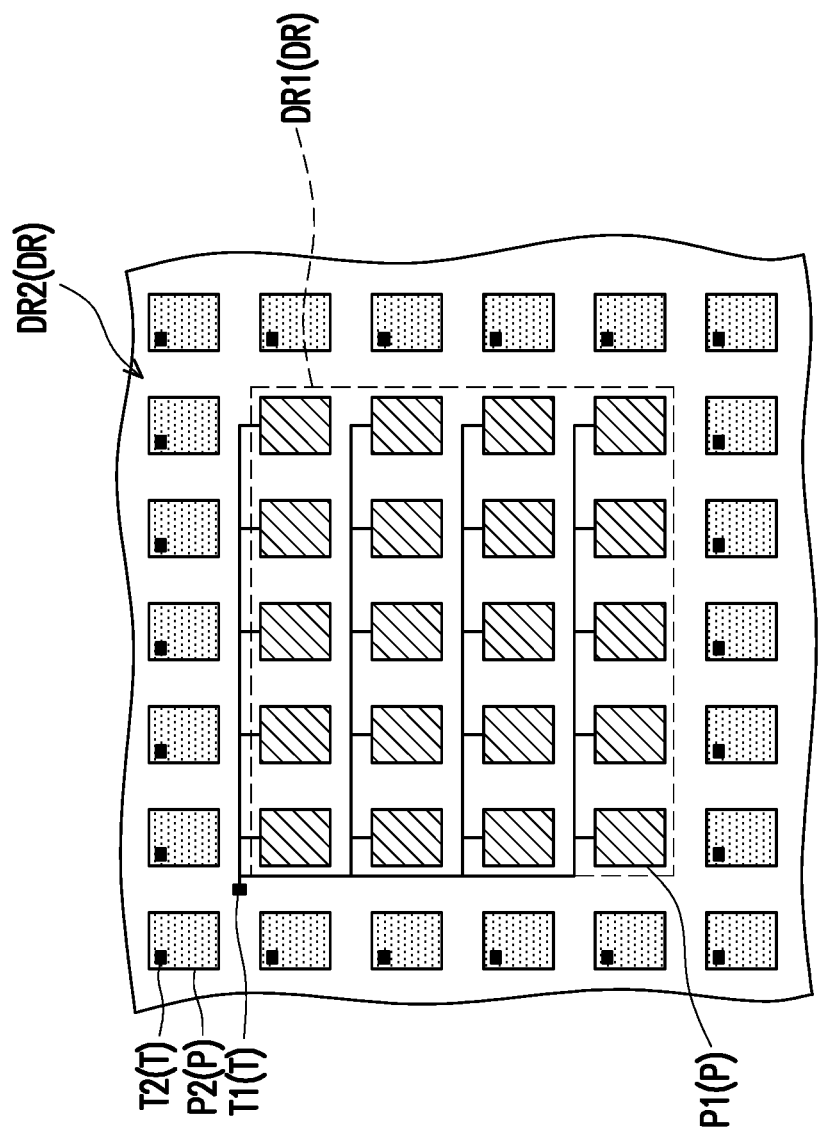

With reference to FIG. 5, the layout of the first active element T1 and relevant wirings of FIG. 5 is substantially similar to that of FIG. 1D, and the main difference is that in the embodiment, the number of the first active element T1 is, for example, one, and that the first active element T1 is electrically connected to the first pixels P1 through the wirings to control the first pixels P1. In other words, in the embodiment, the layout in which the entire region shares one first active element T1 is adopted.

Figure 6:
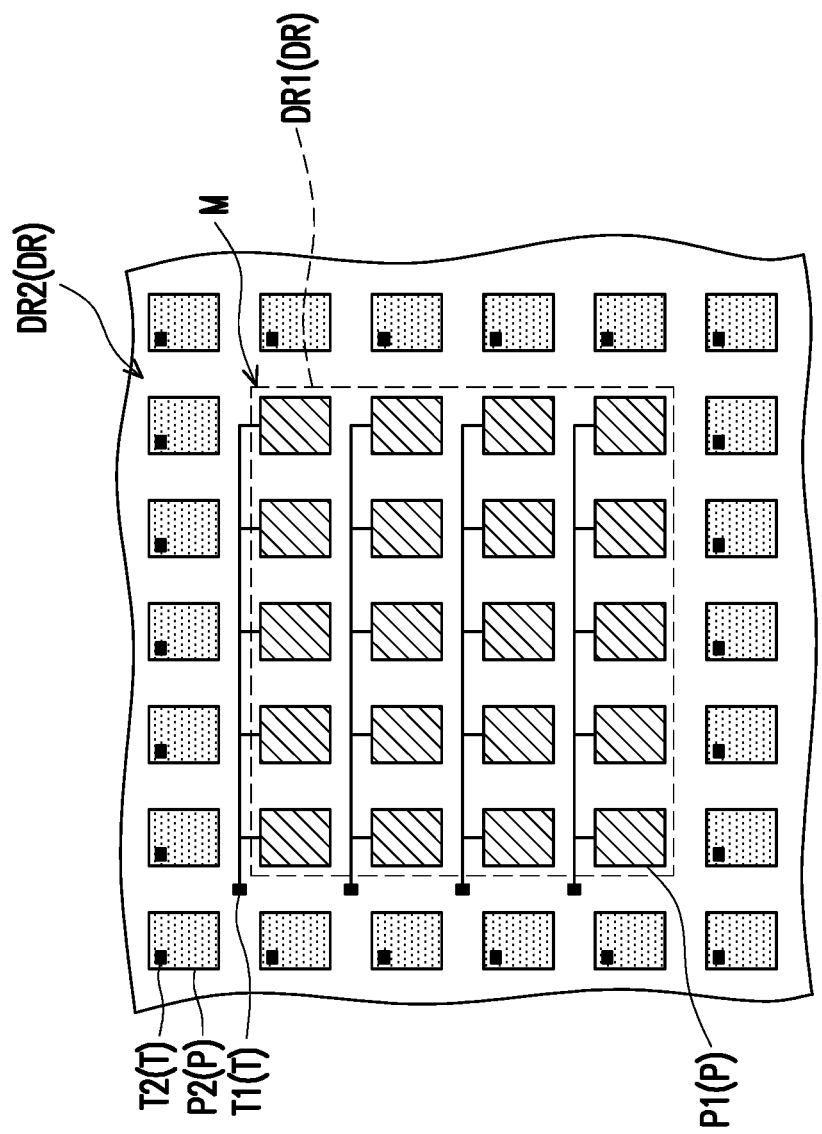

With reference to FIG. 6, the layout of the first active elements T1 and relevant wirings of FIG. 6 is similar to that of FIG. 1D, and the main difference is that in the embodiment, the first pixels P1 are arranged in a matrix M of a plurality of rows and that the first pixels P1 located in the same row are electrically connected to the same first active element T1. Specifically, the first active elements T are disposed on one side (such as the left side) of the first display region DR1, and the first active elements T1 respectively control the corresponding first pixels P1 in the rows in the matrix M through the wirings. In more detail, each of the first active elements T1 controls a part of the first pixels P1 on a single row through the corresponding wirings; however, the disclosure is not limited thereto, and the first active elements T are also respectively disposed on different sides of the first display region DR1.

Figure 7:
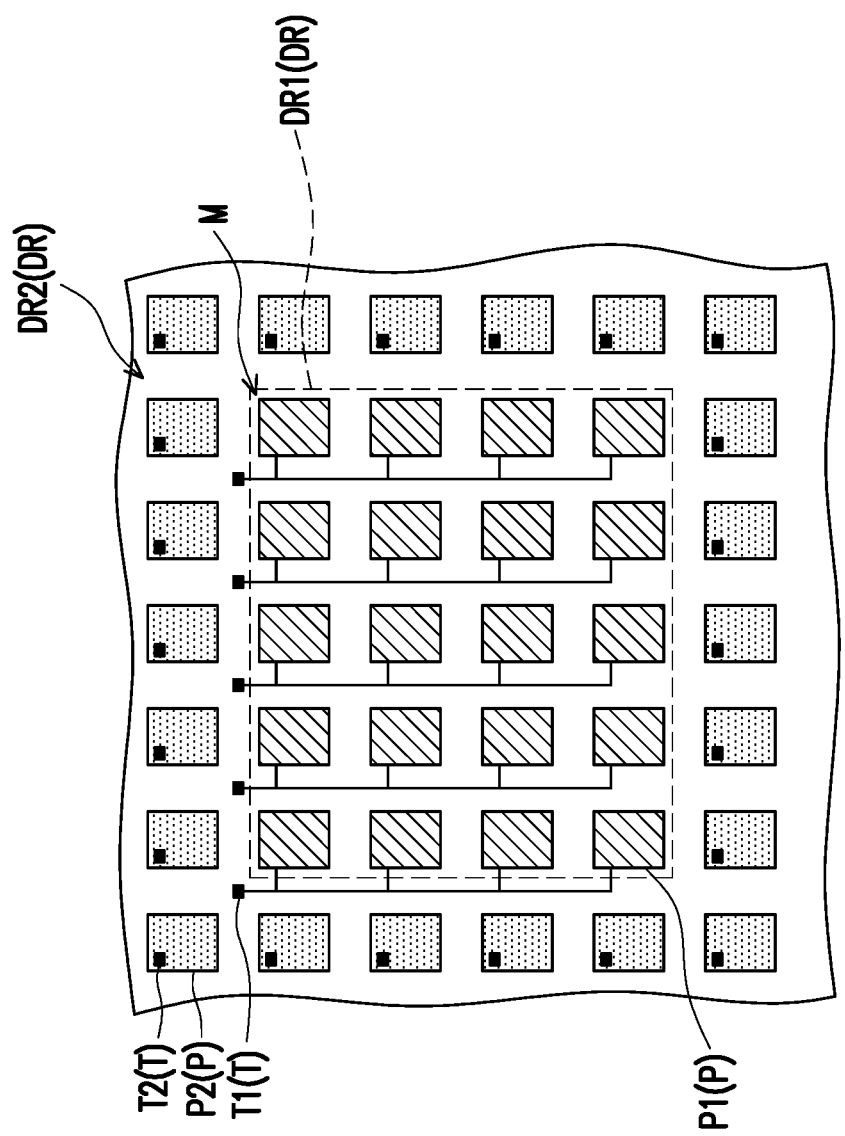

With reference to FIG. 7, the layout of the first active elements T1 of FIG. 7 is similar to that of FIG. 6, and the main difference is that in the embodiment, the first pixels P1 are arranged in a matrix M of a plurality of columns and that the first pixels P1 located in the same column are electrically connected to the same first active element T1. Specifically, the first active elements T are disposed on one side (such as the upper side) of the first display region DR1, and the first active elements T1 respectively control the corresponding first pixels P1 in the columns in the matrix M through the wirings. In more detail, each of the first active elements T1 controls a part of the first pixels P1 on a single column through the corresponding wirings; however, the disclosure is not limited thereto, and the first active elements T are also respectively disposed on different sides of the first display region DR1.

In addition, in the embodiments of FIGS. 5 to 7, the first active elements T1 are also moved to the non-display region NDR (border region BR), and the disclosure is not limited thereto.

Figure 8A:
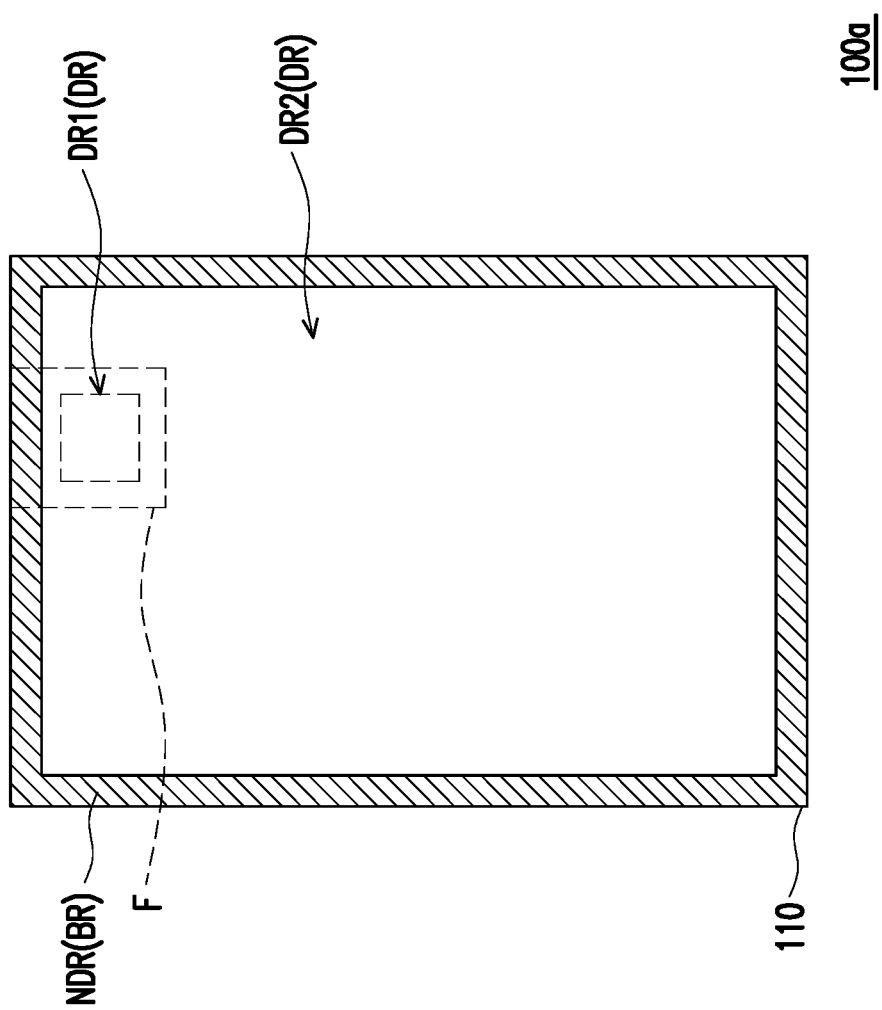
FIG. 8A is a schematic top view of a display apparatus according to another embodiment of the disclosure.
Figure 8B:
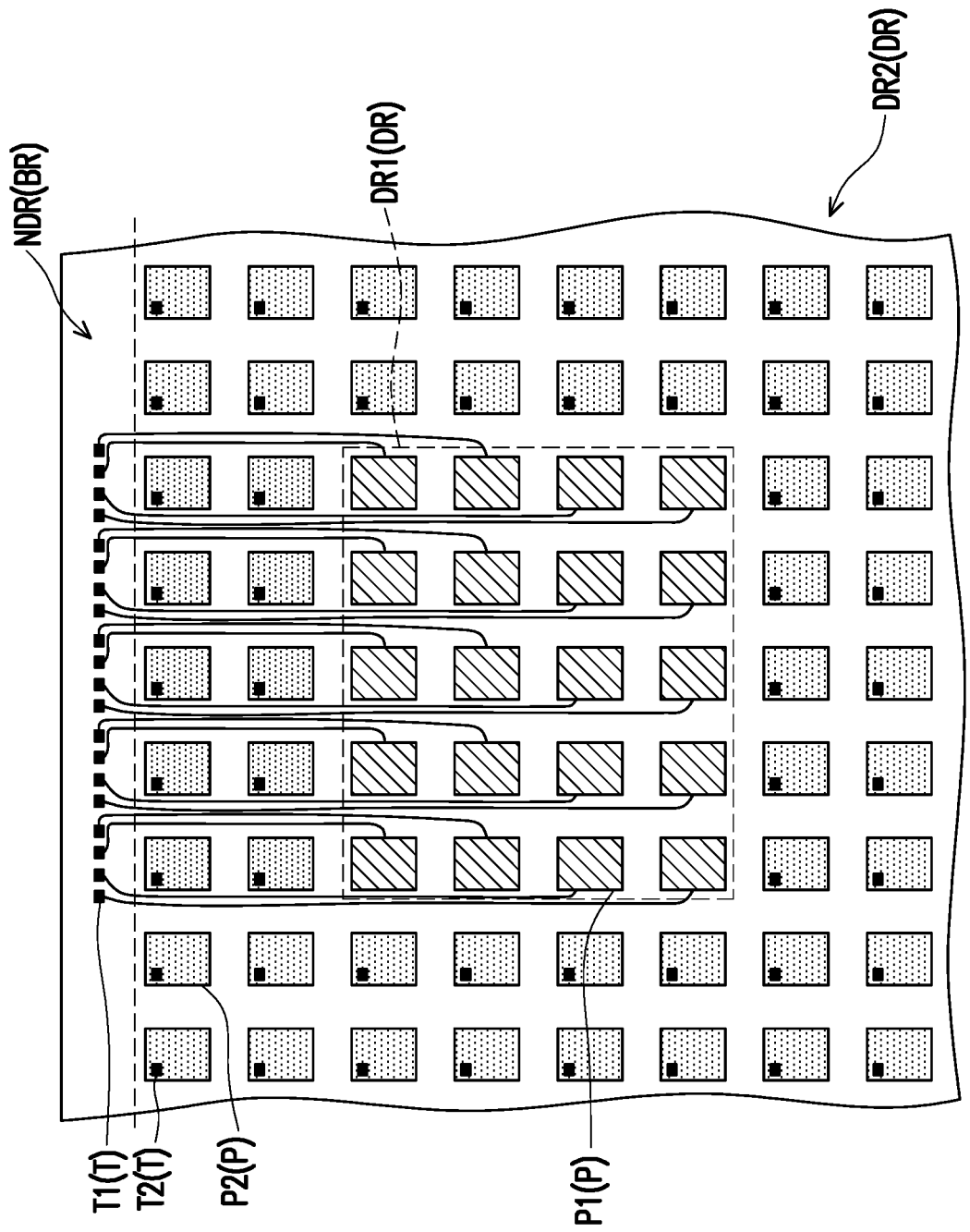
FIG. 8B is an enlarged schematic view of the region F in FIG. 8A.

FIG. 8A is a schematic top view of a display apparatus according to another embodiment of the disclosure. FIG. 8B is an enlarged schematic view of the region F in FIG. 8A. It should be noted that the first signal lines and the second signal lines are omitted in FIG. 8A for clarity in illustration.

With reference to FIGS. 8A and 8B, in the embodiment, the layout of a display apparatus 100a is substantially similar to that of the display apparatus 100 in FIG. 1D, and the main difference is that the first active elements T1 are disposed in the border region BR (non-display region NDR). Moreover, in the embodiment, the border region BR is disposed with a first driving chip and a second driving chip (not shown). The type of each of the driving chips includes, for example, a data driving circuit, a gate driving circuit, a timing driving circuit, or a driving circuit of other types, but it is not limited thereto. The first driving chip is electrically connected to the first pixels P1 located in the border region BR. The second driving chip is electrically connected to the second pixels P2 located in the second display region DR2. The first driving chip is electrically connected to at least one of the first pixels P1 through the at least one first active element T1. The second driving chip is electrically connected to the second pixels P2 through the second active elements T2. In other words, the first pixels P1 and the second pixels P2 are independently driven by the first and second driving chips, respectively, to display an image correspondingly. In other embodiments, the first driving chip is directly connected to the first pixels P1; that is, the first active elements are not disposed between the first driving chip and the first pixels P1. In an embodiment, the first driving chip is electrically connected to the first pixels P1 and the second pixels P2; that is, the pixels P1 and P2 located in the two display regions DR1 and DR2 share one driving chip.

In addition, in the embodiment, the first display region DR1 is surrounded by the second display region DR2; that is, the four sides of the first display region DR1 are adjacent to the second display region DR2.

Figure 9A:
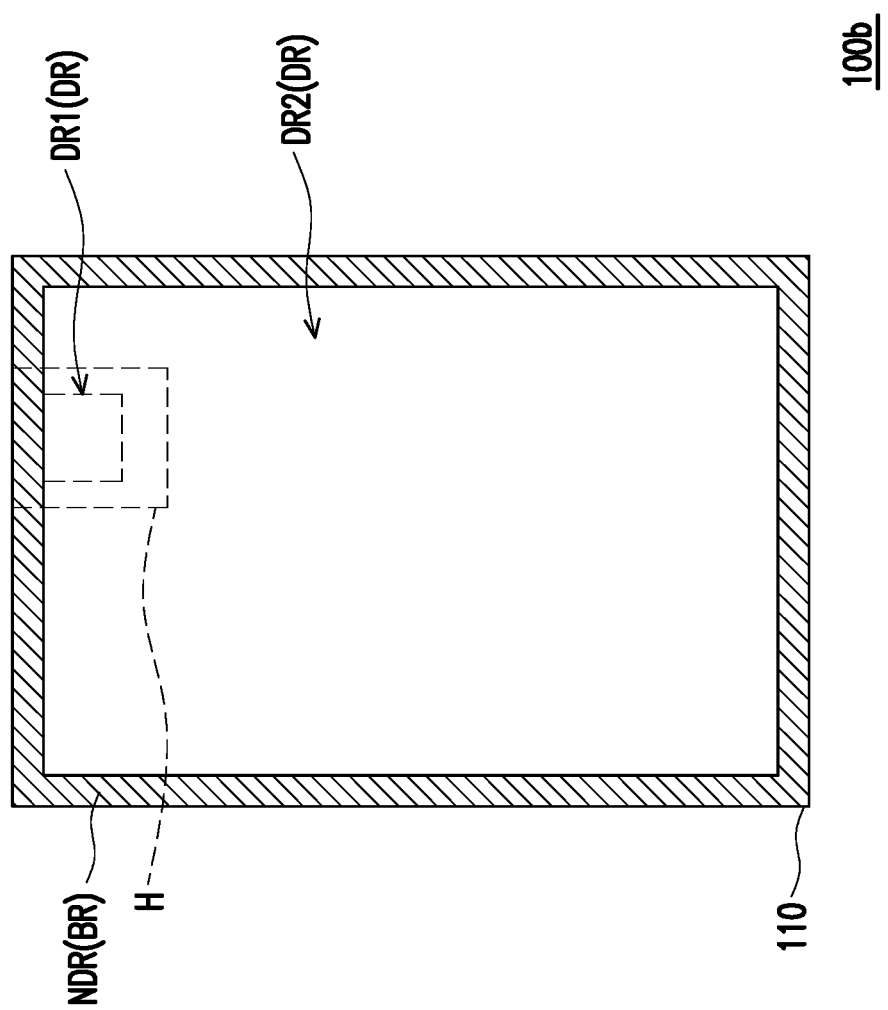
FIG. 9A is a schematic top view of a display apparatus according to another embodiment of the disclosure.
Figure 9B:
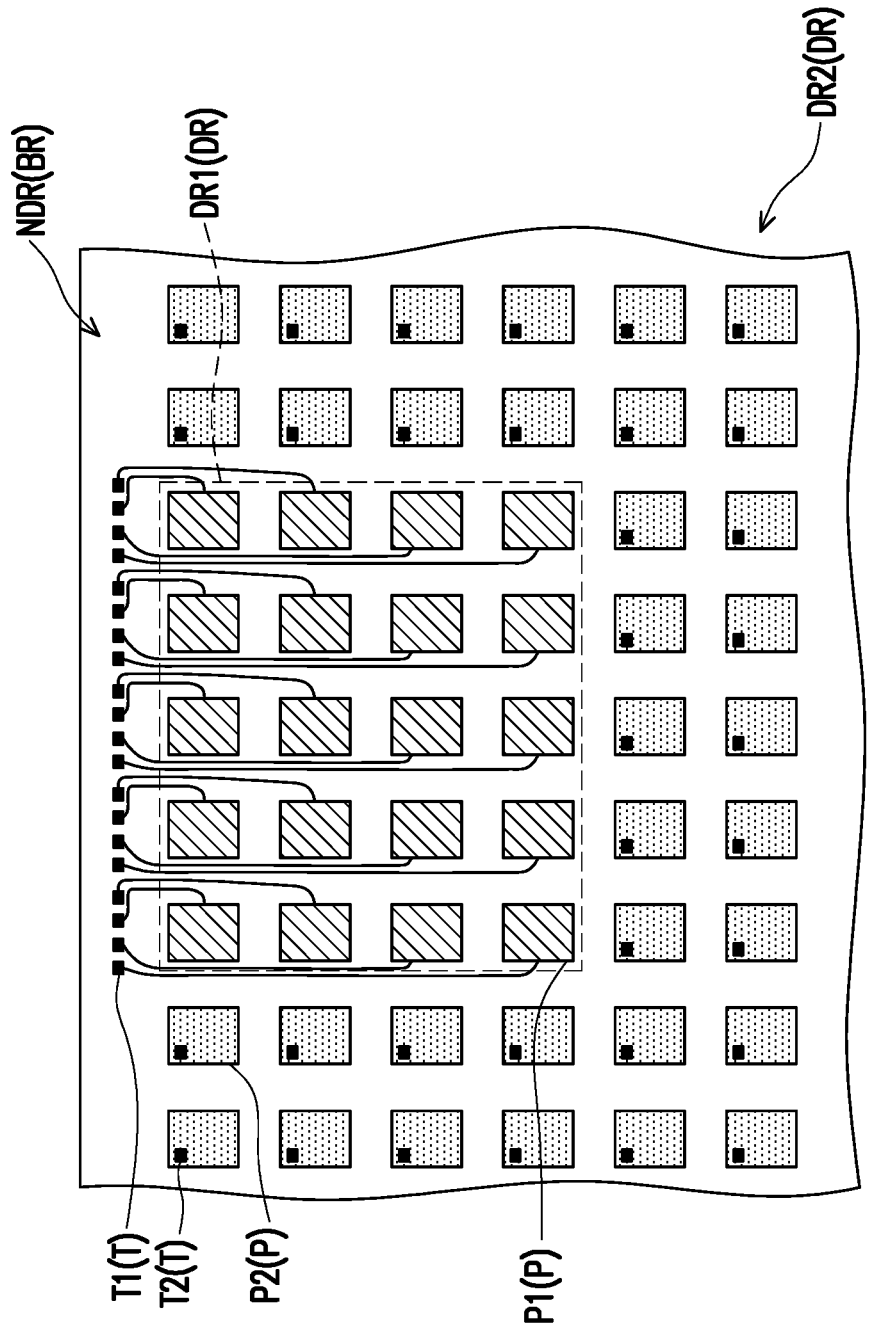
FIG. 9B is an enlarged schematic view of the region H in FIG. 9A.

FIG. 9A is a schematic top view of a display apparatus according to another embodiment of the disclosure. FIG. 9B is an enlarged schematic view of the region H in FIG. 9A. It should be noted that the first signal lines and the second signal lines are omitted in FIG. 9A for clarity in illustration.

With reference to FIGS. 9A and 9B, FIGS. 9A and 9B are substantially similar to FIGS. 8A and 8B, and the main difference is that in a display apparatus 100b, the first display region DR1 is adjacent to the border region BR. More specifically, the second display region DR2 is not disposed between the border region BR and the first display region DR1. That is, the second pixels P2 are not disposed between the first display region DR1 and the border region BR. In other words, the three sides of the first display region DR1 are adjacent to the second display region DR2, and one side of the first display region DR1 is adjacent to the border region BR. Similarly, reference is also made to the embodiment of FIG. 8B for the electrical connection relationship and other related electrical change relationships of FIG. 9B.

In summary of the above, in the display apparatus according to the embodiments of the disclosure, the first active elements for controlling the first pixels located in the first display region are disposed in a region outside the first display region (such as the border region (the non-display region) or the second display region), and thus the first display region has higher transmittance for the corresponding disposition of the required function modules, so that the function design can be adjusted with more flexibility. Moreover, in addition to executing the function of the function module, the display apparatus can coordinately control the plurality of first pixels located in the first display region and the plurality of second pixels located in the second display region to display the screen together to realize the function of simultaneously displaying the screen and executing the function module and has the advantages of a high screen-to-body ratio and a multi-function application.

For example, the above-described function module is a camera module, and the camera module is disposed on the back side of the display apparatus and is correspondingly disposed in the first display region. Accordingly, in addition to displaying the screen, the display apparatus can realize the photographing function of the camera module with the high light transmittance of the first display region.

Although the disclosure has been described with reference to the above embodiments, it will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A display apparatus which has a display region comprising a first display region and a second display region, the display apparatus comprising: a substrate, comprising: a plurality of first pixels disposed in the first display region; a plurality of second pixels disposed in the second display region; at least one first active element disposed outside the first display region and electrically connected to at least one of the plurality of first pixels; and a plurality of second active elements disposed in the second display region and respectively electrically connected to the plurality of second pixels; a first driving circuit disposed on the substrate; a plurality of first signal lines comprising a plurality of first-group first signal lines and a plurality of second-group first signal lines, wherein the plurality of first-group first signal lines are electrically connected to the at least one first active element and the first driving circuit, and the plurality of second-group first signal lines are respectively electrically connected to the plurality of second active elements and the first driving circuit; and wherein respective vertical projections of the at least one first active element and the plurality of first-group first signal lines on the substrate overlap each other.

2. The display apparatus according to claim 1, further comprising: a second driving circuit disposed on the substrate; and a plurality of second signal lines, an extending direction of the plurality of second signal lines being different from an extending direction of the plurality of first signal lines, the plurality of second signal lines comprising a plurality of first-group second signal lines and a plurality of second-group second signal line, wherein the plurality of first-group second signal lines are electrically connected to the at least one first active element and the second driving circuit, and the plurality of second-group second signal lines are respectively electrically connected to a part of the plurality of second active elements and the second driving circuit.

3. The display apparatus according to claim 2, wherein the number of the at least one first active element is a plurality, and disposition positions of each of the plurality of first active elements or a part of the plurality of first active elements correspond to the plurality of first-group second signal lines.

4. The display apparatus according to claim 3, wherein the first driving circuit is a data driving circuit, and the second driving circuit is a gate driving circuit, wherein the gate driving circuit is electrically connected to the at least one first active element and the plurality of second active elements through the plurality of second signal lines, and the data driving circuit is electrically connected to the at least one first active element and the plurality of second active elements through the plurality of first signal lines.

5. The display apparatus according to claim 2, wherein the number of the at least one first active element is a plurality, and the plurality of first pixels are arranged in a matrix, wherein the plurality of first active elements respectively control the corresponding first pixels in a plurality of rows in the matrix.

6. The display apparatus according to claim 1, wherein the at least one first active element is disposed between the first display region and the second display region.

7. The display apparatus according to claim 6, wherein the number of the at least one first active element is a plurality, the plurality of first active elements are respectively electrically connected to the plurality of first pixels, and disposition positions of each of the plurality of first active elements or a part of the plurality of first active elements correspond to the plurality of first-group first signal lines.

8. The display apparatus according to claim 7, wherein the plurality of first active elements are respectively disposed on a first side and a third side of the first display region, the first side and the third side are opposite to each other, the first display region has a first symmetry axis with respect to the first side and the third side, and the first symmetry axis is perpendicular to an extending direction of the plurality of first signal lines, wherein the plurality of first active elements are disposed on the first side and the third side of the first display region according to the first symmetry axis.

9. The display apparatus according to claim 7, wherein at least a part of the plurality of first active elements are respectively disposed on a second side and a fourth side of the first display region, the second side and the fourth side are opposite to each other, the first display region has a second symmetry axis with respect to the second side and the fourth side, and the second symmetry axis is perpendicular to an extending direction of the plurality of second signal lines, wherein the plurality of first active elements are disposed on the second side and the fourth side of the first display region according to the second symmetry axis.

10. The display apparatus according to claim 6, wherein the number of the at least one first active element is a plurality, and the plurality of first pixels are arranged in a matrix, wherein the plurality of first active elements respectively control the corresponding first pixels in a plurality of columns in the matrix.

11. The display apparatus according to claim 1, wherein the number of the at least one first active element is one.

12. The display apparatus according to claim 1, wherein the display apparatus further comprises a non-display region adjacent to the display region, and the at least one first active element is disposed in the non-display region.

13. The display apparatus according to claim 1, further comprising a function module, wherein the function module is correspondingly disposed in the first display region.

14. The display apparatus according to claim 13, wherein the function module is a camera module or a sensing module.

15. The display apparatus according to claim 1, wherein each of the plurality of first pixels further comprises a transmission region.

* * * * *